(12) United States Patent
Lee et al.

(10) Patent No.: US 8,664,762 B2
(45) Date of Patent: Mar. 4, 2014

(54) SEMICONDUCTOR PACKAGE, ELECTRICAL AND ELECTRONIC APPARATUS INCLUDING THE SEMICONDUCTOR PACKAGE, AND METHOD OF MANUFACTURING THE SEMICONDUCTOR PACKAGE

(75) Inventors: Jong-gi Lee, Yongin-si (KR); Sang-wook Park, Hwaseong-si (KR); Ji-seok Hong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/594,841

(22) Filed: Aug. 26, 2012

(65) Prior Publication Data

US 2012/0313244 A1  Dec. 13, 2012

Related U.S. Application Data

(63) Continuation of application No. 13/041,422, filed on Mar. 6, 2011, now Pat. No. 8,288,210.

(30) Foreign Application Priority Data

Jun. 28, 2010  (KR) .................. 10-2010-0061266

(51) Int. Cl.
*H01L 23/48* (2006.01)
(52) U.S. Cl.
USPC .................. 257/738; 257/787; 257/E21.502
(58) Field of Classification Search
None
See application file for complete search history.

(56) References Cited

U.S. PATENT DOCUMENTS

| 6,433,427 | B1 | 8/2002 | Wu et al. |
| 6,818,475 | B2 | 11/2004 | Yang et al. |
| 2004/0155359 | A1* | 8/2004 | Shen .......................... 257/782 |
| 2005/0064624 | A1 | 3/2005 | Murakami |

FOREIGN PATENT DOCUMENTS

| JP | 2002-043462 | 2/2002 |
| JP | 2003-218278 | 7/2003 |
| JP | 2004-072043 | 3/2004 |
| JP | 2005-093772 | 4/2005 |
| JP | 2006-294948 | 10/2006 |
| JP | 2008-153696 | 7/2008 |
| KR | 1020050028313 | 3/2005 |
| KR | 1020090088068 | 8/2009 |
| KR | 1020090116352 | 11/2009 |

* cited by examiner

*Primary Examiner* — Cheung Lee
(74) *Attorney, Agent, or Firm* — Renaissance IP Law Group LLP

(57) ABSTRACT

In one embodiment, a semiconductor package may include a semiconductor chip having a chip pad formed on a first surface thereof, a sealing member for sealing the semiconductor chip and exposing the first surface of the semiconductor chip, a conductive wiring overlying a part of the first surface of the semiconductor chip and directly contacting a part of an upper surface of the sealing member. The conductive wiring further contacts the pad. The semiconductor package may also include an encapsulant covering the conductive wiring and having openings for exposing parts of the conductive wiring.

9 Claims, 13 Drawing Sheets

US 8,664,762 B2

SEMICONDUCTOR PACKAGE, ELECTRICAL AND ELECTRONIC APPARATUS INCLUDING THE SEMICONDUCTOR PACKAGE, AND METHOD OF MANUFACTURING THE SEMICONDUCTOR PACKAGE

CROSS-REFERENCE TO RELATED APPLICATIONS

This application is a continuation of U.S. patent application Ser. No. 13/041,422, filed on Mar. 6, 2011 and claims the benefit of Korean Patent Application No. 10-2010-0061266, filed on Jun. 28, 2010, in the Korean Intellectual Property Office, the disclosures of which are incorporated herein in their entirety by reference.

BACKGROUND

The inventive concept relates to a semiconductor package, and more particularly, to a semiconductor package manufactured without having to perform a photolithography process, and a method of manufacturing the semiconductor package.

In general, various semiconductor processes are performed on wafers to form a plurality of semiconductor chips. Thereafter, the semiconductor chips are mounted on printed circuit boards (PCB) to form semiconductor packages. The semiconductor packages may each include a semiconductor chip, the PCB on which the semiconductor chip is mounted, a bonding wire or bump used to electrically connect the semiconductor chip and the PCB, and a sealing member used to seal the semiconductor chip.

Recently, as semiconductor chips have become more highly integrated, semiconductor chips have also become smaller and accordingly, semiconductor packages also need to become smaller.

SUMMARY

According to an aspect of the inventive concept, a method of manufacturing a semiconductor package is provided. The method may include providing a semiconductor chip having a chip pad and forming a conductive wiring electrically connected to the pad overlying the semiconductor chip using a soft-lithography process.

According to another aspect of the inventive concept, a semiconductor package may include a semiconductor chip having a chip pad formed on a first surface thereof, a sealing member for sealing the semiconductor chip and exposing the first surface of the semiconductor chip, a conductive wiring overlying a part of the first surface of the semiconductor chip and directly contacting a part of an upper surface of the sealing member. The conductive wiring further contacts the pad. The semiconductor package may also include an encapsulant covering the conductive wiring and having openings for exposing parts of the conductive wiring.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1:
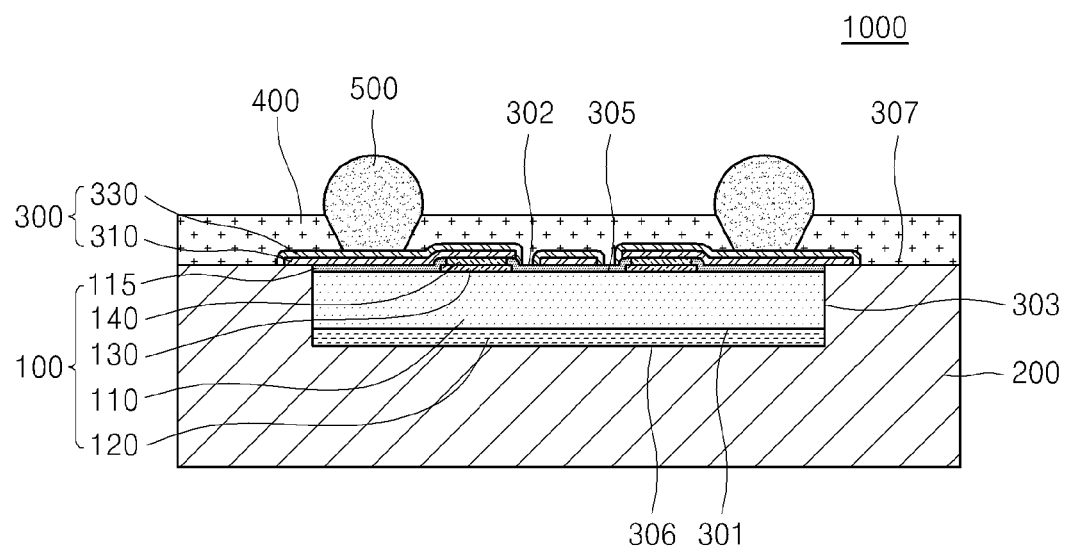
FIG. 1 is a cross-sectional view of a semiconductor package, according to an embodiment of the inventive concept.

Reference will now be made in detail to exemplary embodiments, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

FIG. 1 is a cross-sectional view of a semiconductor package 1000, according to an embodiment of the inventive concept.

Referring to FIG. 1, the semiconductor package 1000 includes a semiconductor chip 100, a sealing member 200, a conductive wiring such as a metal wiring 300, an encapsulant, e.g., a solder resist (SR) 400, and solder balls 500.

A protection film 120 formed of a polymer material may be adhered to a rear surface 301 of the semiconductor substrate 110. A pad 130 and a pad connector 140 may be used to connect the metal wiring 300 to the semiconductor chip 100 and may be formed on a front surface 305 of the semiconductor substrate 110. Here, the front surface 305 of the semiconductor substrate 110 may be an active surface of the semiconductor chip 100. A front surface of the semiconductor chip 100 may be referred to as a first surface 302, and a rear surface of the semiconductor chip 100 may be referred to as a second surface 306.

The pad 130 may be formed of a conductive material, e.g., metal, such as aluminum (Al) copper (Cu), silver (Ag), gold (Au), or the like, and may have a thickness of about 3 to about 10 μm. In one embodiment, the pad connector 140 may be formed on the pad 130 by plating. The plating of the pad connector 140 onto the pad 130 may be electrolytic plating or electroless plating, and may use a plating material, such as nickel (Ni), copper (Cu), gold (Au), palladium (Pd), or the like. The pad connector 140 may be a single layer or multi-layer. For example, the pad connector 140 may be formed as a nickel single layer or a nickel/palladium double layer.

The pad connector 140 may have nearly the same thickness as a bump so as to perform the function of the bump. For example, the pad connector 140 may have a thickness of about 5 to about 10 μm. As shown in FIG. 1, the pad connector 140 may have substantially the same height as a protection layer 115. The protection layer 115 may be formed, for example, of photosensitive polyimide (PSPI), and may be formed on the first surface 305 of the semiconductor substrate 110 to protect the semiconductor chip 100. Alternatively, the height of the pad connector 140 may be greater than that of the protection layer 115 to enable the metal wiring 300 disposed on an upper portion of the pad connector 140 to be more firmly connected to the pad connector 140.

To prevent cracks from forming in the semiconductor chip 100, the protection film 120 may be formed on the rear surface 301 of the semiconductor substrate 110 to protect the semiconductor chip 100 from pressure applied to the semiconductor chip 100 during the process of forming the metal wiring 300 by a soft lithography process such as printing or SR patterning.

The sealing member 200 seals the semiconductor chip 100 and blocks outside elements or impurities from reaching the semiconductor chip 100. The sealing member 200 may be a thermosetting or thermoplastic epoxy resin. In the present embodiment, the sealing member 200 may cover only the second surface 306 and side surfaces 303 of the semiconductor chip 100. Thus, the first surface 302 of the semiconductor chip 100 may not be sealed by the sealing member 200 and be exposed through the sealing member 200.

The metal wiring 300 may be formed over the first surface 302 of the semiconductor chip 100 and electrically connected to the pad connector 140. The metal wiring 300 may extend from the first surface 302 of the semiconductor chip 100 toward the sealing member 200 so that the solder balls 500 may be formed having a fan-out structure.

According to some embodiments, the metal wiring 300 overlying a part of the first surface 302 of the semiconductor chip 100 may directly contact the upper surface of the sealing member 200.

The solder balls 500 form a fan-out structure when at least one of the solder balls 500 is not formed over the first surface 302 of the semiconductor chip 100. On the other hand, the solder balls 500 form a fan-in structure when all of the solder balls 500 are formed over the first surface of the semiconductor chip 100. The solder balls 500 of FIG. 1 form the fan-in structure.

The metal wiring 300 may be formed using a soft-lithography process, such as imprinting or offset printing (e.g., roll-to-roll (R2R) printing), a stencil printing process, a screen printing process, or an ink-jet printing process, for example. The offset printing may be a gravure offset printing process, a reverse offset printing process, or a plate-to-plate offset printing process. The soft-lithography process may be processes described in the co-pending application Ser. No. 13/037,159, which claims priority to the Korean patent application No. 10-2010-0043052, filed on May 7, 2010, in the Korean Intellectual Property Office, which is assigned to the same assignee as the current application and the contents of which are incorporated herein by reference in their entirety.

Imprinting such as nano or micro imprinting is where a pattern previously formed on a medium is transferred onto another object by stamping the pattern of the medium on the object. According to some embodiments, soft-lithography processes such as nano or micro imprinting may be used to form a fine pattern such as the metal wiring 300 or an the SR pattern.

The metal wiring 300 may include a seed metal 310 and a plating metal 330. The seed metal 310 may be formed first by a soft-lithography process such as imprinting, and the plating metal 330 may then be formed on the seed metal 310 by plating. When desired, the seed metal 310 may instead be formed by sputtering or evaporating.

The seed metal 310 may include silver (Ag), copper (Cu), gold (Au), or the like. The seed metal 310 may be formed over the first surface 302 of the semiconductor chip 100 to have a predetermined pattern by printing a silver or copper paste and then sintering the imprinted paste. The seed metal 310 may have a thickness of about 3 μm to about 5 μm. However, if the metal wiring 300 includes only the seed metal 310, the thickness of the seed metal 310 may increase. For example, the seed metal 310 may have a thickness of about 5 μm to about 10 μm so that the seed metal 310 may be used as the metal wiring 300 without the plating metal 330.

According to one aspect of the inventive concept, the surface roughness of the seed metal 310 formed by imprinting may be higher than that of a layer formed by evaporating or plating. For example, the seed metal 310 may have a ten point average roughness Rz of about 3 μm to about 5 μm.

The plating metal 330 may include at least one of nickel (Ni), copper (Cu), gold (Au), palladium (Pd), or the like. For example, the plating metal 330 may be formed as a nickel/gold double layer. The plating metal 330 may be formed by electrolytic plating or electroless plating, and have a thickness of about 5 μm to about 10 μm. As shown, the plating metal 330 may be formed on upper and side surfaces of the seed metal 310.

The SR 400 may be formed on the metal wiring 300 and the sealing member 200. The SR 400 may also be formed by a soft-lithography process or printing, for example, imprinting such as R2R printing, screen printing, or the like.

The SR 400 may be formed by imprinting to have a predetermined pattern, for example, an opening that exposes a predetermined part of the metal wiring 300. Solder balls 500 may be disposed on the exposed part of the metal wiring 300. The SR 400 may have a thickness of about 5 μm to about 10 μm. When desired, the SR 400 may have a thickness greater than about 10 μm, for example, about 20 μm.

The solder balls 500 may be formed in the opening of the SR 400 and electrically connected to the metal wiring 300. The solder balls 500 may be formed in an array structure on an outer surface of the semiconductor package 1000 to form a ball grid array (BGA). As described above, the solder balls 500 may form a fan-out structure or a fan-in structure. Furthermore, the solder balls 500 may be disposed in a fan-in and fan-out boundary part, i.e. a part where the semiconductor chip 100 and the sealing member 200 contact each other. The solder balls 500 do not need to be formed on a thermal stress relaxation layer and may be directly formed on the metal wiring 300 through the opening of the SR 400.

Although the materials and thicknesses of the pad 130, the pad connector 140, the metal wiring 300, and the SR 400 of the semiconductor package 1000 are described in the present embodiment, the present invention is not limited thereto. When desired, the pad 130, the pad connector 140, the metal wiring 300, and the SR 400 of the semiconductor package 1000 may be formed of different materials and have different thicknesses.

According to some embodiments, since the pad connector 140 may be formed on the pad 130 by plating, a photolithography process for forming a bump on the semiconductor package 1000 may not be necessary. In addition, since the metal wiring 300 and the SR 400 may be formed by a soft-lithography process, e.g., imprinting, a photolithography process for the metal wiring 300 and the SR 400 on the semiconductor package 1000 may not be necessary, thereby simplifying a manufacturing process, reducing turn around time (TAT), and greatly reducing manufacturing costs of the semiconductor package 1000.

Figure 2:
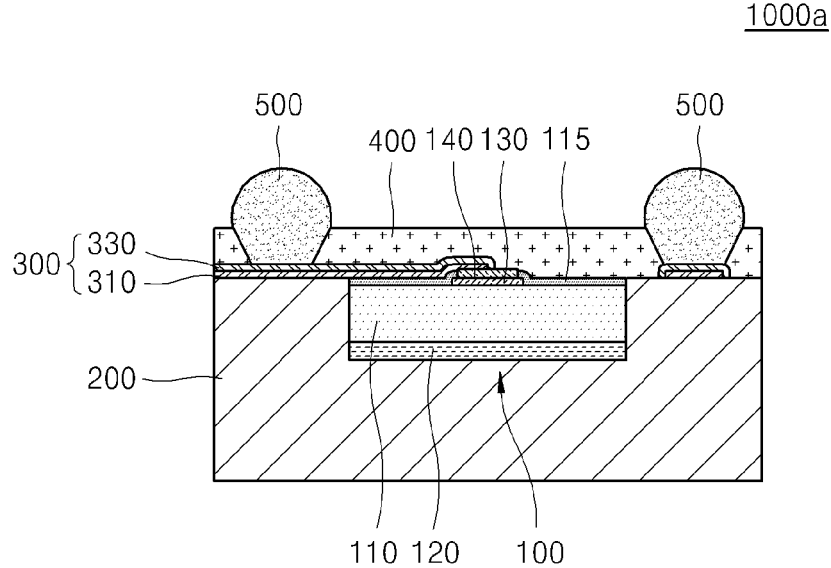
FIG. 2 is a cross-sectional view of a semiconductor package, according to another embodiment of the inventive concept.

FIG. 2 is a cross-sectional view of a semiconductor package 1000a, according to another embodiment of the inventive concept. Differences between the semiconductor package 1000 of FIG. 1 and the semiconductor package 1000a of FIG. 2 will now be described, and the descriptions of the elements that remain the same therebetween will not be repeated here.

Referring to FIG. 2, the semiconductor package 1000a of the present embodiment is similar to the semiconductor package 1000 of FIG. 1, but differs in that the solder ball 500 of the semiconductor package 1000a has a fan-out structure rather than the fan-in structure. In other words, the solder balls 500 of the semiconductor package 1000a are not formed over the first surface 302 of the semiconductor chip 100.

Also, in some embodiments, the pad connector 140 may be higher than the protection layer 115. Although the shapes and thicknesses of the pad 130, the pad connector 140, the seed metal 310 and the plating metal 330 of the metal wiring 300, and the solder ball 500 are different from those shown in FIG. 1, this is merely exemplary. That is, where the solder balls 500 form only a fan-out structure, the metal wiring 300, the pad 130, and the pad connector 140 may have the same shapes and thicknesses as shown in FIG. 1.

Although the metal wiring 300 of a right side is shown to be disconnected from the pad connector 140 according to the cross-sectional view of the semiconductor package 1000a of FIG. 2, the metal wiring 300 on the right side may be connected to the other pad connector 140 (not shown) of the semiconductor package 1000a.

Figure 3:
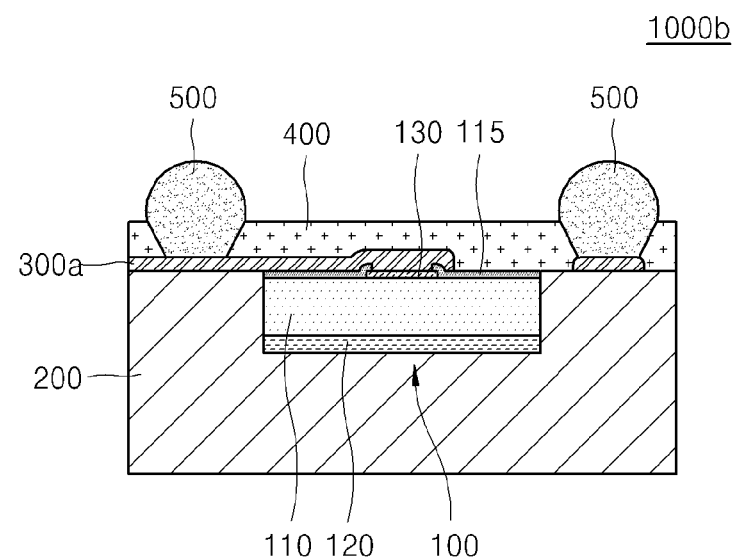
FIG. 3 is a cross-sectional view of a semiconductor package, according to another embodiment of the inventive concept.

FIG. 3 is a cross-sectional view of a semiconductor package 1000b, according to another embodiment of the inventive concept. Differences between the semiconductor package 1000a of FIG. 2 and the semiconductor package 1000b of FIG. 3 will now be described, and the descriptions of the elements that remain the same therebetween will not be repeated here.

Referring to FIG. 3, unlike the semiconductor package 1000a of FIG. 2, no pad connector is formed on the pad 130, and a metal wiring 300a may be formed as a single layer in the semiconductor package 1000b.

The metal wiring 300a may be formed by a soft-lithography process such as imprinting (e.g., R2R printing), screen printing, or the like, and may have a thickness of about 5 to about 10 μm. To directly connect the metal wiring 300a to the pad 130 while forming the metal wiring 300a by imprinting, the thickness of the protection layer 115, which is formed on the first surface 302 of the semiconductor chip 100 around the pad 130, may be very small. For example, the protection layer 115 may have a thickness of about 1~about 3 μm.

Although the metal wiring 300a completely covers the pad 130 in FIG. 3, the present invention is not limited thereto, and the metal wiring 300a may instead contact only a portion of the pad 130.

In one embodiment, the semiconductor package 1000b may not include a pad connector but may include the metal wiring 300a having a single layer formed by imprinting, for example, thereby further simplifying a manufacturing process, dramatically reducing TAT, and substantially reducing manufacturing costs of the semiconductor package 1000b. The semiconductor package 1000b of the present embodiment may thus be implemented as a bumpless BGA structure package.

Figure 4:
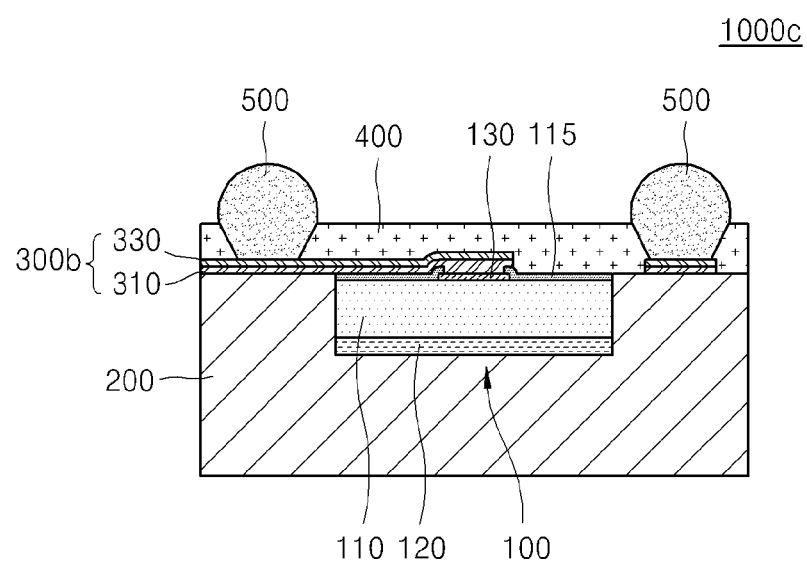
FIG. 4 is a cross-sectional view of a semiconductor package, according to another embodiment of the inventive concept.

FIG. 4 is a cross-sectional view of a semiconductor package 1000c, according to another embodiment of the inventive concept. Differences between the semiconductor package 1000a of FIG. 2, the semiconductor package 1000b of FIG. 3, and the semiconductor package 1000c of FIG. 4 will now be described, and the descriptions of the elements that remain the same therebetween will not be repeated here.

Referring to FIG. 4, unlike the semiconductor package 1000b of FIG. 3, a metal wiring 300b is formed as a double layer including the seed metal 310 and the plating metal 330. Further, unlike the semiconductor package 1000a of FIG. 2, the plating metal 330 is not formed on the side surface of the seed metal 310. Such structural differences result from different methods of forming the metal wiring 300b of FIG. 4 as compared to the metal wiring 300a of FIG. 2. For example, the metal wiring 300b of the present embodiment uses a polymer pattern formed by imprinting. This will be later described in more detail with reference to FIGS. 17 through 21.

Figure 5:
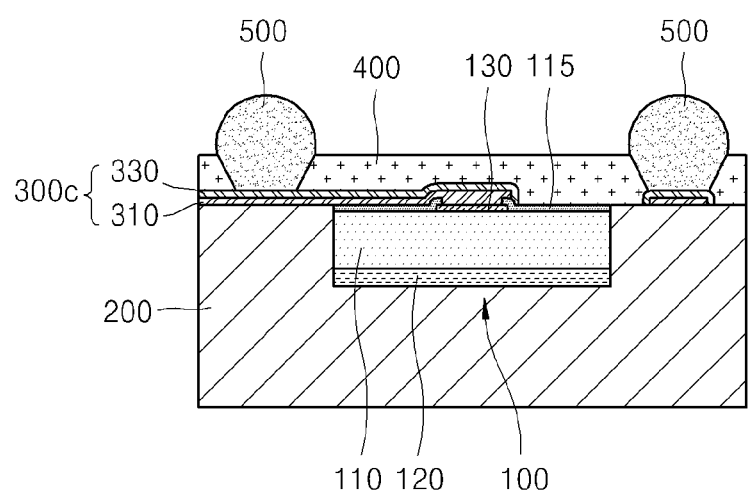
FIG. 5 is a cross-sectional view of a semiconductor package, according to another embodiment of the inventive concept.

FIG. 5 is a cross-sectional view of a semiconductor package 1000d, according to another embodiment of the inventive concept. Differences between the semiconductor package 1000c of FIG. 4 and the semiconductor package 1000d of FIG. 5 will now be described, and the descriptions of the elements that remain the same therebetween will not be repeated here.

Referring to FIG. 5, unlike the semiconductor package 1000c of FIG. 4, the plating metal 330 of a metal wiring 330c may be formed on the upper and side surfaces of the seed metal 310. Meanwhile, the metal wiring 300c may still directly contact the pad 130.

FIGS. 6 through 15 are cross-sectional views for explaining a method of manufacturing the semiconductor package 1000a of FIG. 2, according to an embodiment of the inventive concept.

Figure 6:
FIGS. 6 through 15 are cross-sectional views of a semiconductor package at various stages during manufacture for explaining a method of manufacturing the semiconductor package of FIG. 2, according to an embodiment of the inventive concept.

Referring to FIG. 6, the pad connector 140 is formed on the pad 130 by plating such as electroless plating or electrolytic plating. The pad 130 may be formed of aluminum (Al), copper (Cu), silver (Ag), gold (Au), or the like, and may have a thickness of about 3 μm to about 10 μm. The pad connector 140 may use nickel (Ni), copper (Cu), gold (Au), palladium (Pd), or the like, and may have a thickness of about 5 μm to about 10 μm. Although the pad connector 140 may be formed as a nickel single layer, the pad connector 140 may alternatively be formed as a nickel/palladium double layer.

Although the pad connector 140 may have substantially the same height as the protection layer 115 for protecting the first surface of the semiconductor chip 100, the pad connector 140 may be higher than the protection layer 115 as shown. Thus, the pad connector 140 may slightly protrude from the protection layer 115. A process for forming the pad connector 140 may be performed during a wafer level operation before semiconductor chips are separated from each other.

Figure 7:
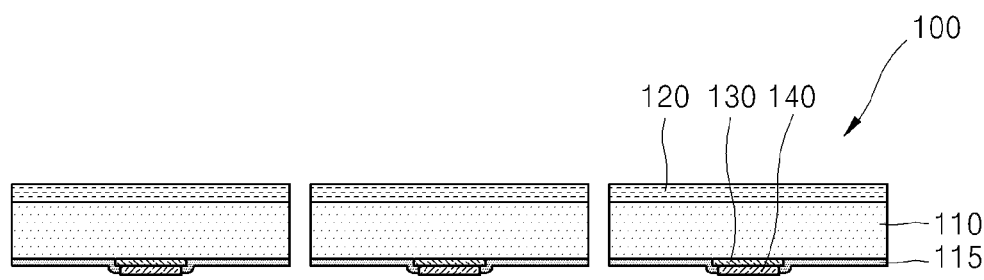

Referring to FIG. 7, after the pad connector 140 is formed, a back-lap (B/L) process of polishing a rear surface of a wafer, i.e., second surfaces of semiconductor chips included in the wafer, occurs and a protection film 120 may be formed on the rear surface of the wafer. The protection film 120 absorbs pressure applied to the semiconductor chip 100 during a subsequent printing process to prevent cracks from forming in the semiconductor chip 100.

After the protection film 120 is formed, the wafer is diced to singulate semiconductor chips 100.

Figure 8:
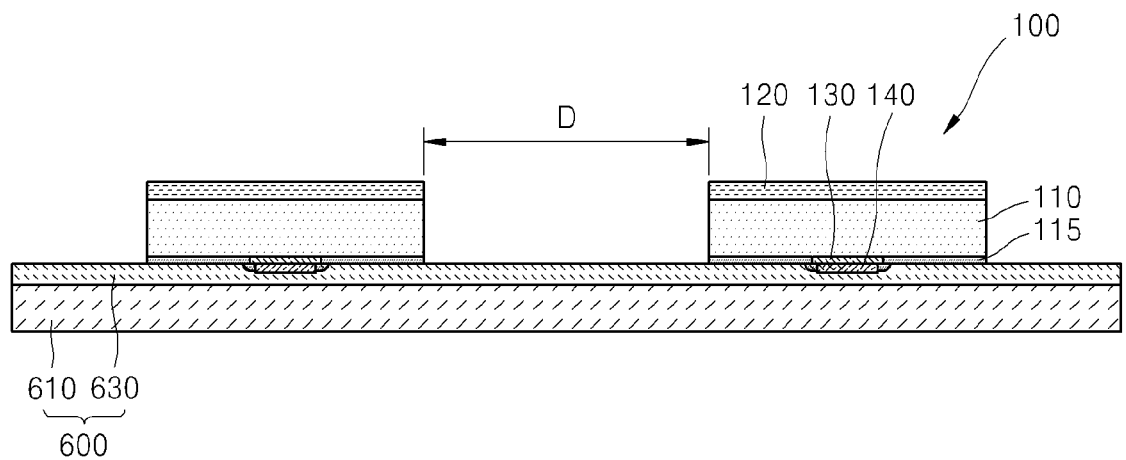

Referring to FIG. 8, each semiconductor chip 100 may be bonded to a tape 610 of a carrier 600. The tape 630 is bonded to the pad connector 140 and the protection layer 115 formed over the first surface 302 of the semiconductor chip 100. The carrier 600 may include a carrier metal 630 and the tape 610.

On the other hand, before the tape 610 is bonded to the semiconductor chip 100, a patterning process for aligning the semiconductor chip 100 on the tape 610 may be formed on the tape 630.

In more detail, the carrier 600 may be nearly the same size as or bigger than the wafer, and may include the carrier metal 630 in a lower portion thereof and the tape 610 in an upper portion thereof. The tape 610 may be easily detachable. For example, the tape 610 may be a laminate or a UV film that is easily removed by UV radiation. According to an aspect of the inventive concept, a pattern for aligning the semiconductor chip 100 can be formed on the tape 610. The semiconductor chip 100 can thereby be precisely bonded on the pattern, and thus subsequent processes can be precisely performed.

According to some embodiments, a distance D between the semiconductor chip 100 and another semiconductor chip 100 bonded onto the carrier 600 may be properly adjusted according to a required size of the semiconductor package 1000a. Even if the size of the semiconductor chip 100 is reduced, since the standard size of the semiconductor package 1000a has been previously determined, the reduction of the distance D between the semiconductor chips 100 may be somewhat limited. For example, in a fan-out structure, a metal wiring extends to an area of an upper surface of a sealing member where there is no semiconductor chip and a solder ball is disposed on the metal wiring overlying the upper surface of the sealing member where there is no semiconductor chip.

Figure 9:
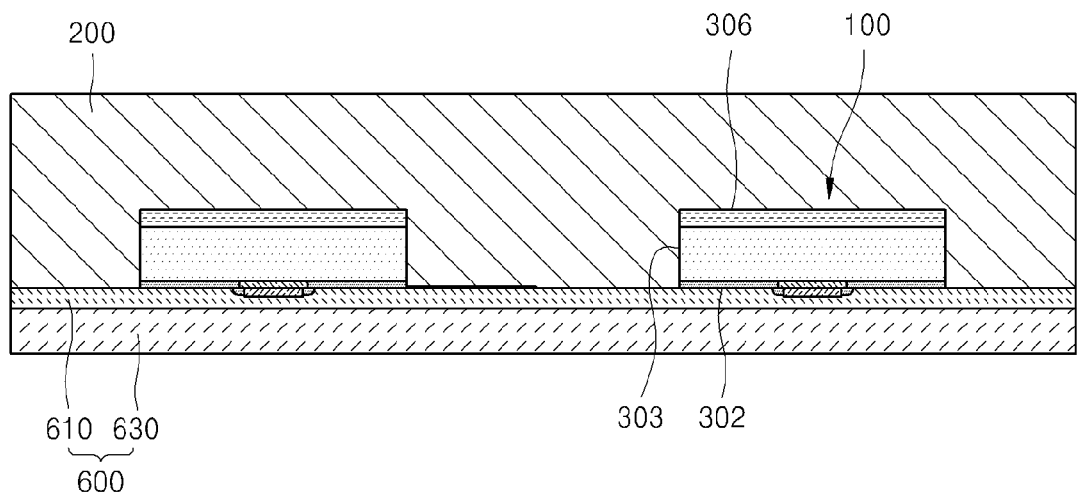

Referring to FIG. 9, after the semiconductor chip 100 is bonded onto the carrier 600, the semiconductor chip 100 may be sealed by using the sealing member 200, which can be a known encapsulant such as an epoxy molding compound. For reference, since the tape 610 is bonded onto the first surface 302 of the semiconductor chip 100, only the second surface 306 and the side surface 303 of the semiconductor chip 100 may be surrounded by the sealing member 200, and thus the first surface 302 thereof may not be sealed by, i.e., may be exposed through, the sealing member 200.

Figure 10:
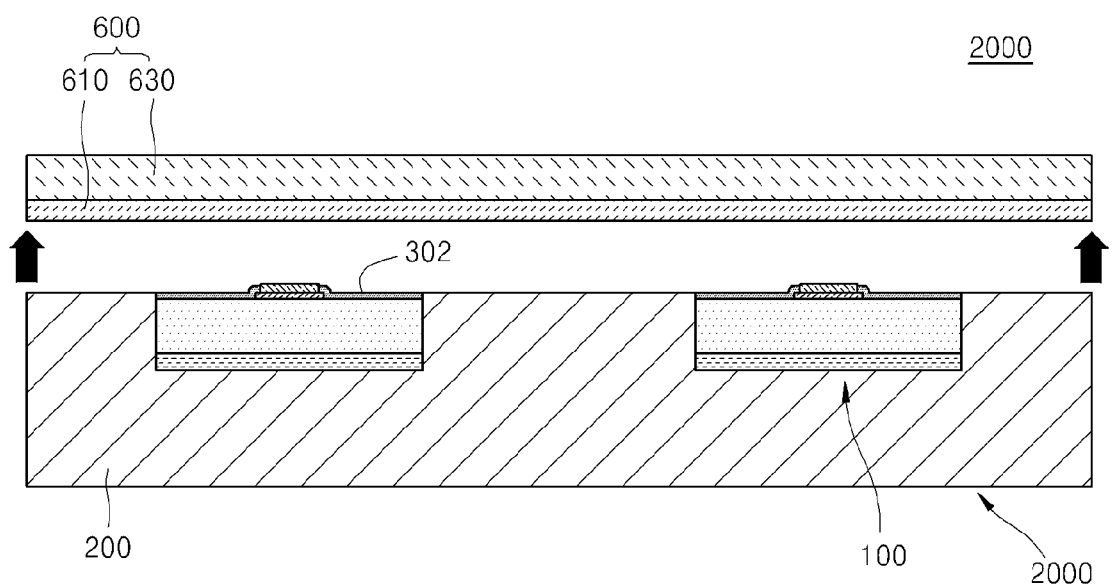

Referring to FIG. 10, after the sealing process is performed, a package complex 2000 including the semiconductor chip 100 and the sealing member 200 may be separated from the carrier 600. After the separation process is performed, the first surface 302 of the semiconductor chip 100 is exposed.

Figure 11:
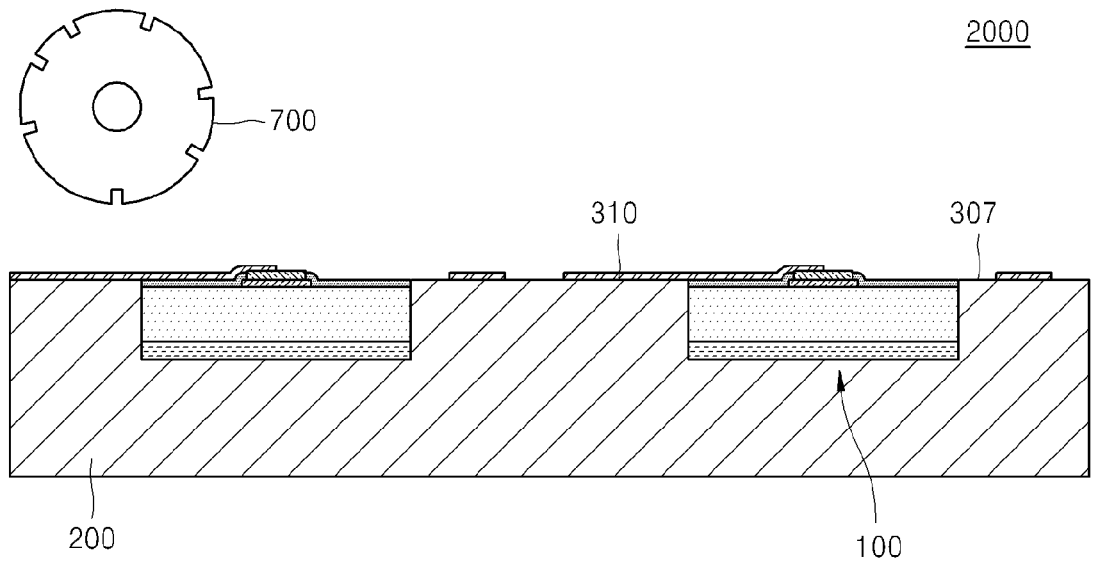

Referring to FIG. 11, the seed metal 310 may be formed over the first surface 302 of the semiconductor chip 100 and on a portion of the sealing member 200 using a soft-lithography process such as imprinting, off-set printing (e.g., R2R printing), screen printing, or the like. The seed metal 310 may include silver (Ag), copper (Cu), gold (Au), or the like. The seed metal 310 may be formed to have a predetermined pattern on the first surface 302 of the semiconductor chip 100 and on an upper surface 307 of the sealing member 200, extending from the first surface 302 of the semiconductor chip 100. A roller 700, for instance, could be used to, deposit a silver or copper paste. The seed metal 310 may have a thickness of about 3 μm to about 5 μm.

Figure 12:
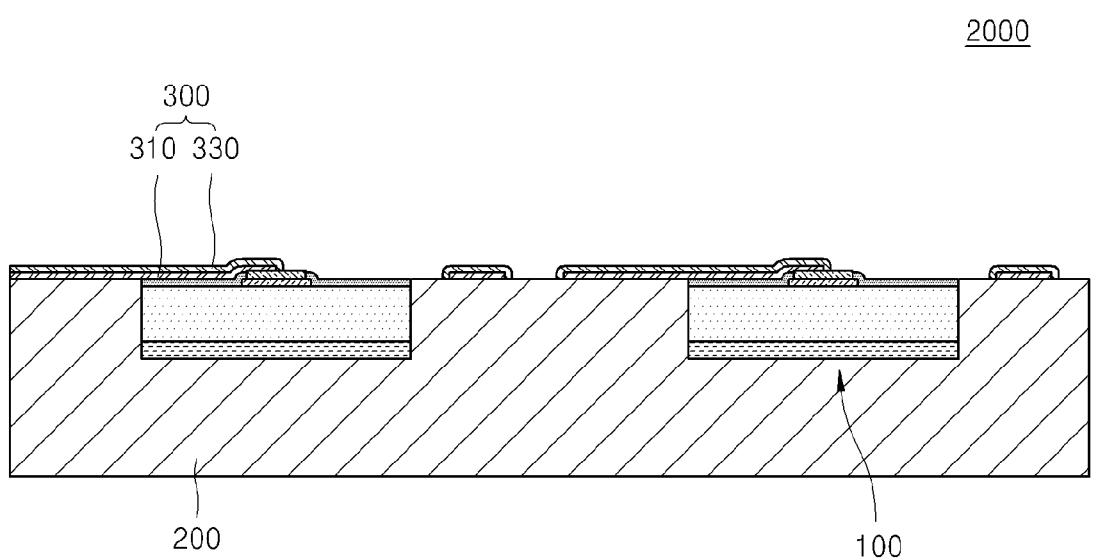

Referring to FIG. 12, after the seed metal 310 is formed, the plating metal 330 is formed on the seed metal 310 by electrolytic plating or electroless plating. The plating metal 330 may include at least one of nickel (Ni), copper (Cu), gold (Au), palladium (Pd), or the like, and have a thickness of about 5 μm to about 10 μm. The metal wiring 300 may thus be a multi-layer that includes the seed metal 310 and the plating metal 330 in different combinations, including, for example, Ag/Cu, Cu/Ni, Ag/Ni, Ag/Ni/Pd, or the like. The thicknesses of the seed metal 310 and the plating metal 330 may be adjusted according to a desired thickness of the metal wiring 300.

Figure 13:
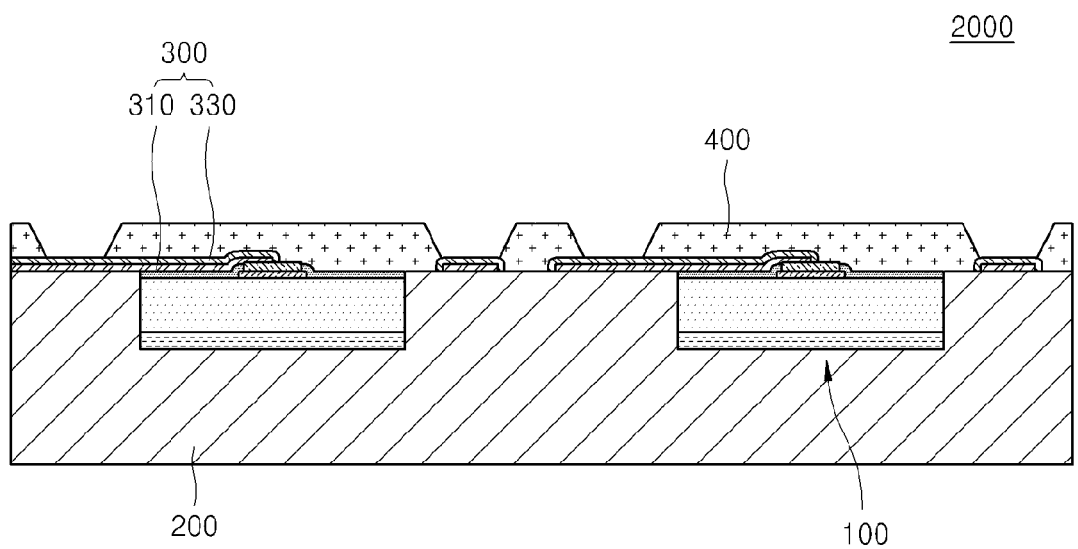

Referring to FIG. 13, after the metal wiring 300 is formed, the SR 400 may be formed by a soft-lithography process such as offset printing (e.g., R2R printing), screen printing or the like. The SR 400 may be formed on an upper surface of the metal wiring 300, a part over the first surface of the semiconductor chip 100 on which the metal wiring 300 is not formed, and a part of the upper surface of the sealing member 200 on which the metal wiring 300 is not formed. The SR 400 may be formed of polymer, and include an opening to expose a portion of the metal wiring 300. The opening may expose only the upper surface of the metal wiring 300, or may instead expose the upper surface and a side surface thereof when desired. The SR 400 may have a thickness of about 5 μm to about 10 μm. The thickness of the SR 400 may alternatively be up to about 20 μm.

Figure 14:
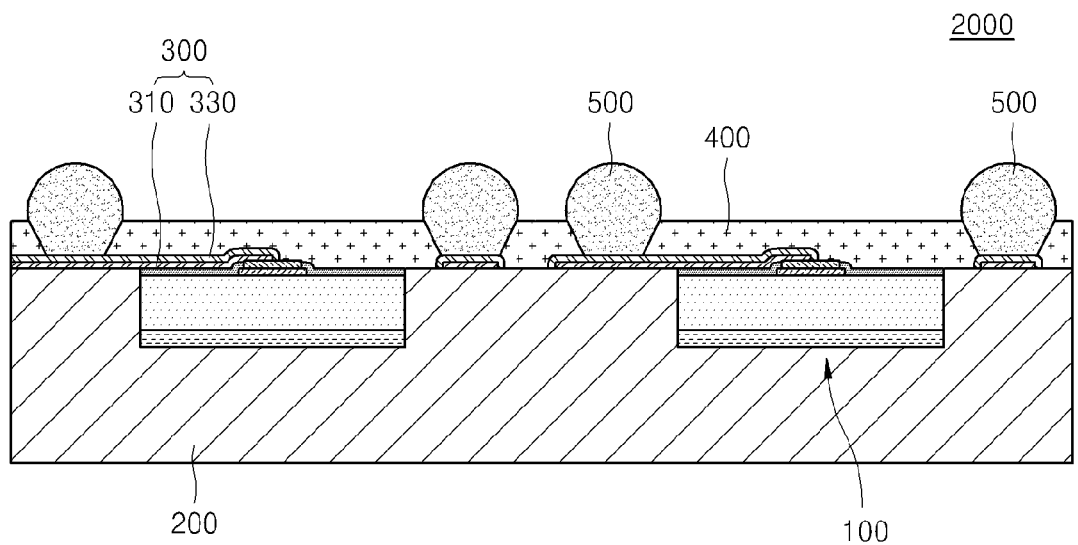

Referring to FIG. 14, the solder ball 500 may be formed in the opening of the SR 400. The solder ball 500 forms a BGA with a fan-out structure. In the present embodiment, the solder ball 500 may be formed on the metal wiring 300 without forming a bump, thus forming a bumpless BGA. The metal wiring 300 may be formed as an Ag/Ni/Au multilayer, so as to improve wetting of a solder, prevent diffusion thereof, and the like.

According to some embodiments, although the solder ball 500 of the present embodiment has a fan-out structure in which the solder ball 500 is not disposed over the semiconductor chip 100, the solder ball 500 may alternatively have a fan-in structure as shown in FIG. 1. Also, the present invention is not limited thereto, and the solder ball 500 may be formed at the borderline between the sealing member 200 and the semiconductor chip 100.

Figure 15:
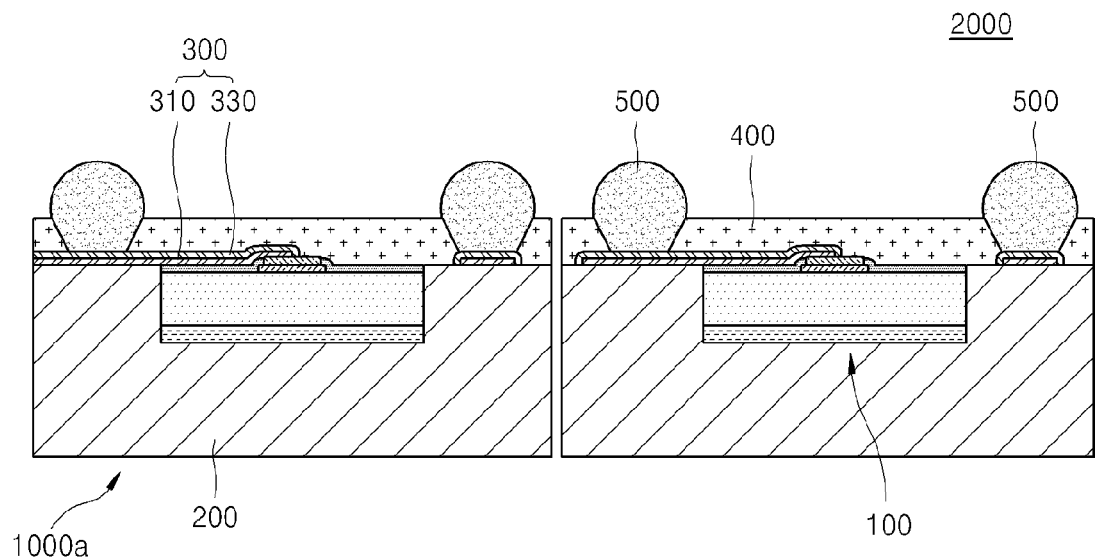

Referring to FIG. 15, after the solder ball 500 is formed, a singulation process of separating the package complex 2000 into semiconductor packages can be performed, where each of the singulated semiconductor packages may be a semiconductor package 1000a as shown in FIG. 2. The semiconductor packages are completed after the singulation process.

The method of manufacturing a semiconductor package 1000a according to some embodiments may not include performing a photolithography process and may instead form the sealing member 200, the metal wiring 300, and the SR 400 using a soft-lithography process at a wafer level. This method therefore does not require a PCB, thereby simplifying a manufacturing process, reducing TAT, and greatly reducing manufacturing costs of the semiconductor package 1000a.

For example, because the metal wiring 300 may be formed using an off-set printing process such as a R2R printing process, the metal wiring 300 can be formed on multiple semiconductor chips in a single wafer in less than 2 minutes. Further, the time taken to perform a conventional laser via drilling process for an opening of a pad or a bump can be reduced or eliminated. Furthermore, the method of manufacturing the semiconductor package 1000a according to some embodiments can eliminate the need for expensive laser equipment for the photolithography process, thereby dramatically reducing manufacturing costs of the semiconductor package 1000a.

Figure 16:
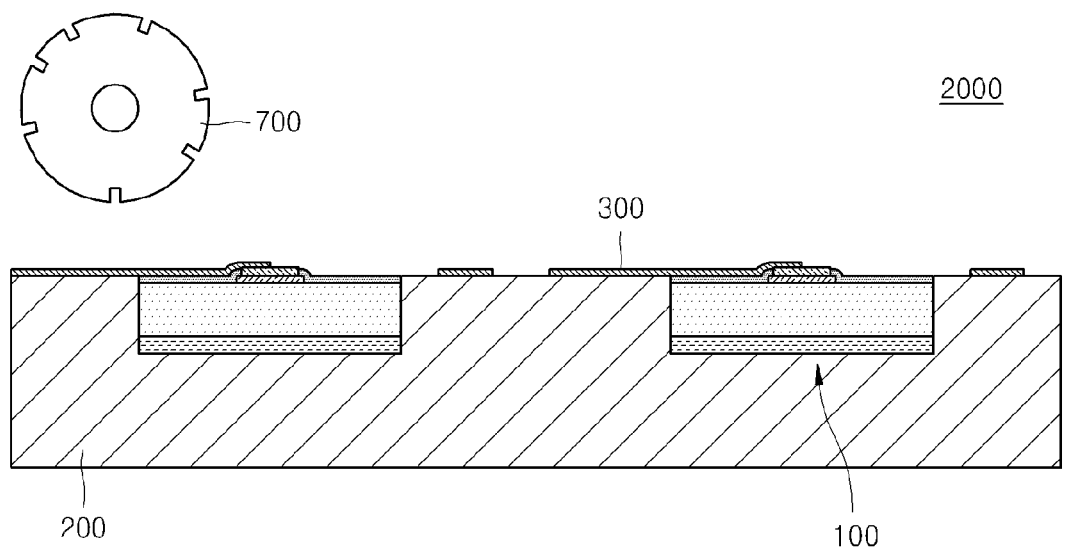
FIG. 16 is a cross-sectional view of a semiconductor package for explaining a method of manufacturing the semiconductor package of FIG. 2, according to another embodiment of the inventive concept.

FIG. 16 is a cross-sectional view of a semiconductor package for explaining a method of manufacturing the semiconductor package 1000a of FIG. 2, according to another embodiment of the inventive concept. This embodiment may replace the embodiment described with reference to FIGS. 11 and 12.

Referring to FIG. 16, the metal wiring 300 may be formed as a single layer instead of a double layer including a seed metal and a plating metal such as one shown in FIGS. 11 and 12. Thus, the metal wiring 300 may be formed by imprinting such as R2R printing using a roller 700, and may include silver (Ag), copper (Cu), gold (Au), or the like. According to one aspect, since the metal wiring 300 is formed as a single layer, the metal wiring 300 may have a thickness of about 5 µm to about 15 µm. When the metal wiring 300 is formed by imprinting only, the surface roughness of the metal wiring 300 may be higher than that of a metal wiring formed by plating or evaporating. For example, the seed metal 310 may have a ten-point average roughness Rz of about 3 µm to about 5 µm.

Subsequent processes can be the same as those shown in FIGS. 13 through 15.

FIGS. 17 through 21 are cross-sectional views of a semiconductor package for explaining a method of manufacturing the semiconductor package 1000a of FIG. 2, according to another embodiment of the inventive concept. The present embodiment may replace the embodiment described with reference to FIGS. 11 and 12.

Figure 17:
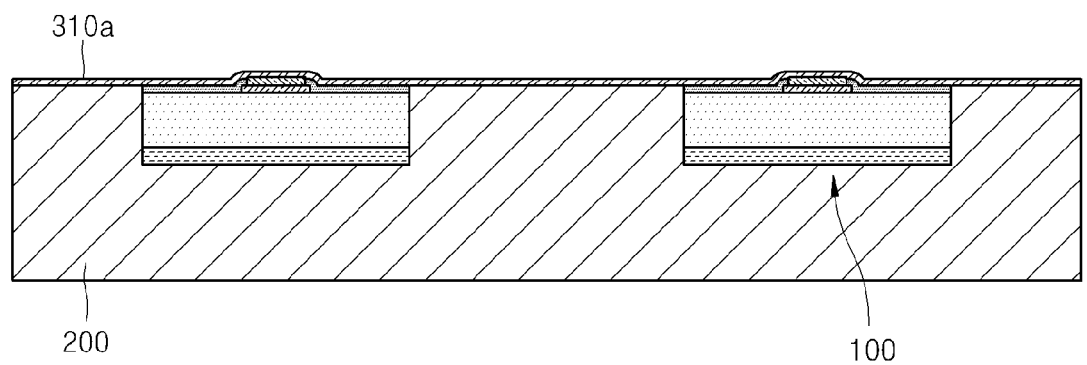
FIGS. 17 through 21 are cross-sectional views of a semiconductor package at various stages during manufacture for explaining a method of manufacturing the semiconductor package of FIG. 2, according to another embodiment of the inventive concept.

Referring to FIG. 17, after the package complex 2000 is separated from the carrier 600, a metal material is deposited on substantially the entire first surface of the semiconductor chip 100 and substantially the entire upper surface of the sealing member 200 to form a seed metal 310a. The seed metal 310a may, for instance, be formed by electroless plating, sputtering, evaporating, or the like.

Figure 18:
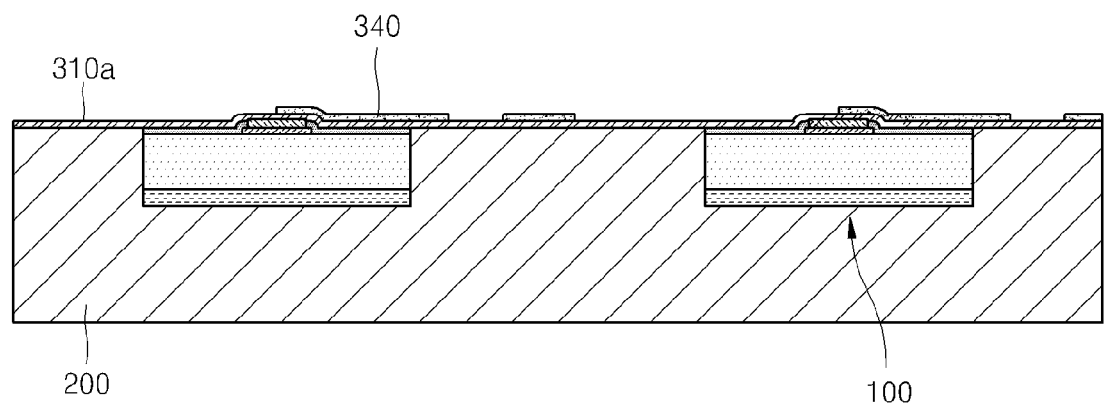

Referring to FIG. 18, a polymer pattern 340 can then be formed on the seed metal 310a using a soft-lithography process such as an off-set printing (e.g., R2R printing), screen printing, or the like. The polymer pattern 340 may have a thickness adjusted according to that of a plating metal 330 to be subsequently formed. Further, the polymer pattern 340 may be formed on a part in which a metal wiring is not to be formed, compared to FIGS. 11 and 12. In other words, the seed metal 310 shown in FIG. 11 may have a pattern opposite to that of the polymer pattern 340 of the present embodiment.

Figure 19:
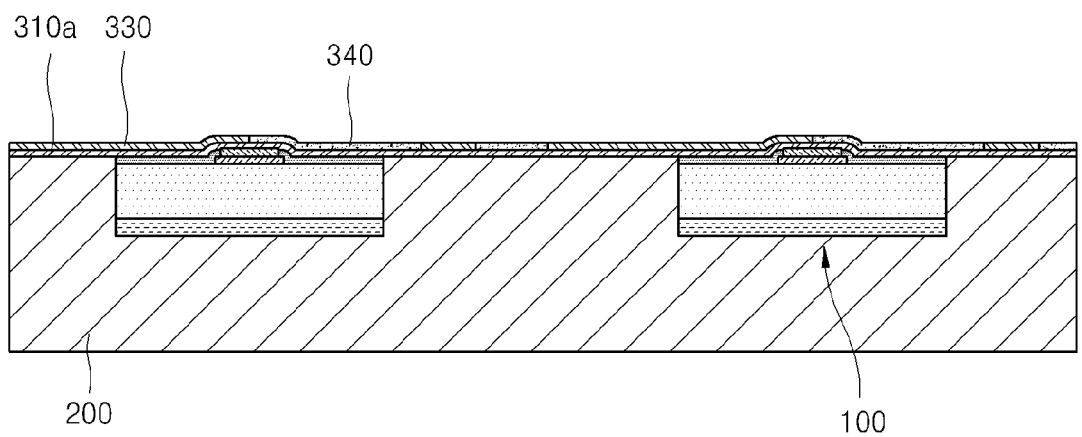

Referring to FIG. 19, the plating metal 330 can be formed by electrolytic or electroless plating. The plating metal 330 may be formed on a part of the seed metal 310a on which the polymer pattern 340 is not formed. The plating metal 330 may be copper (Cu) or nickel (Ni), and may have a thickness of about 5 µm to about 10 µm.

Figure 20:
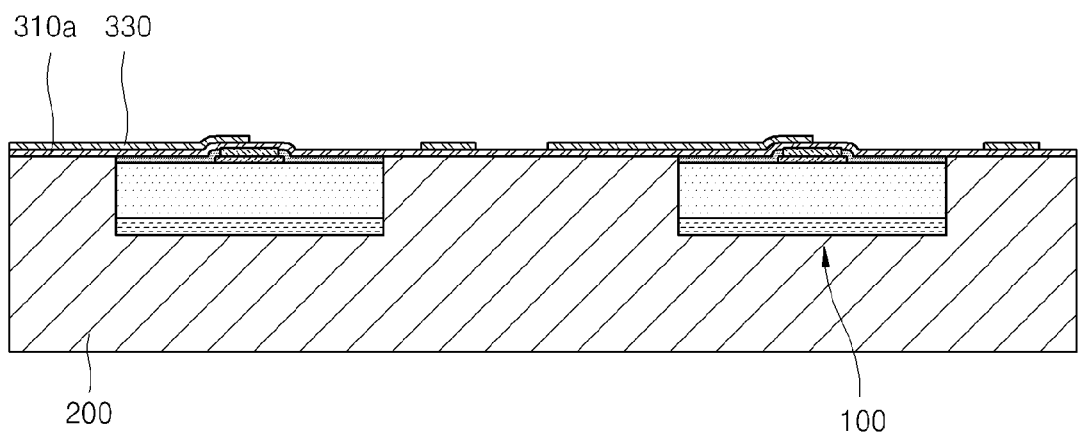

Referring to FIG. 20, after the plating metal 330 is formed, the polymer pattern 340 may be removed by an etching process such as a lift-off process. A portion of the seed metal 310a may be exposed after the polymer pattern 340 is removed.

Figure 21:
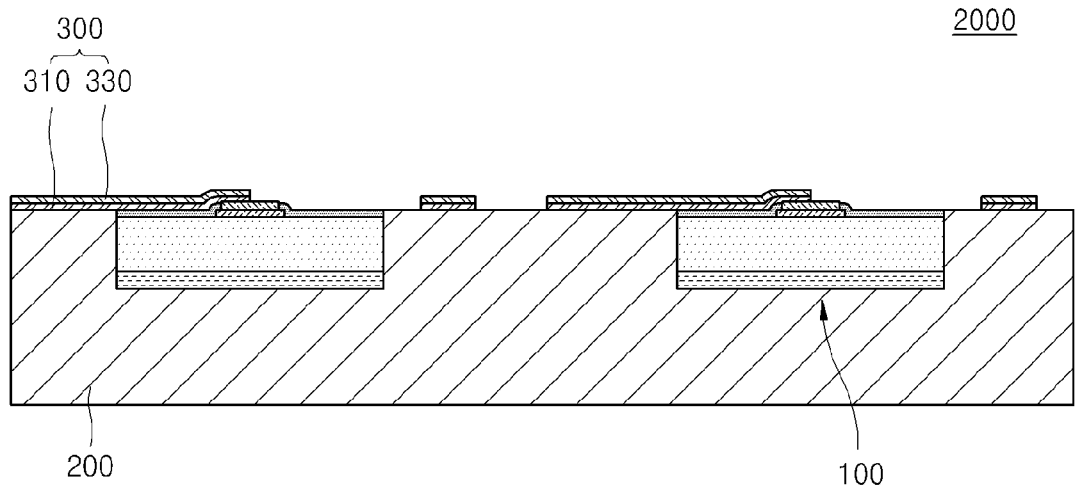

Referring to FIG. 21, after the polymer pattern 340 is removed, the exposed part of the seed metal 310a may be removed by, for example, an etching process. That is, a portion of the seed metal 310a exposed by removal of the polymer pattern 340 may be removed using the plating metal 330 as a mask. Thus, by removing this portion of the seed metal 310a, the metal wiring 300 has substantially the same structure as that shown in FIG. 4. The etching process may be used so that the plating metal 330 is not formed on the side surface of the seed metal 310.

Subsequent processes may be the same as those shown in FIGS. 13 through 15.

Figure 22:
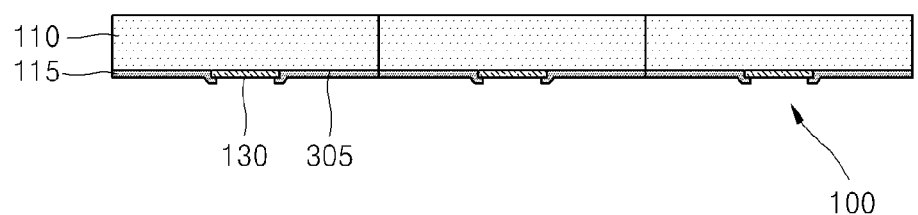
FIGS. 22 and 23 are cross-sectional views of a semiconductor package for explaining a method of manufacturing the semiconductor package of FIG. 3, according to an embodiment of the inventive concept.
Figure 23:
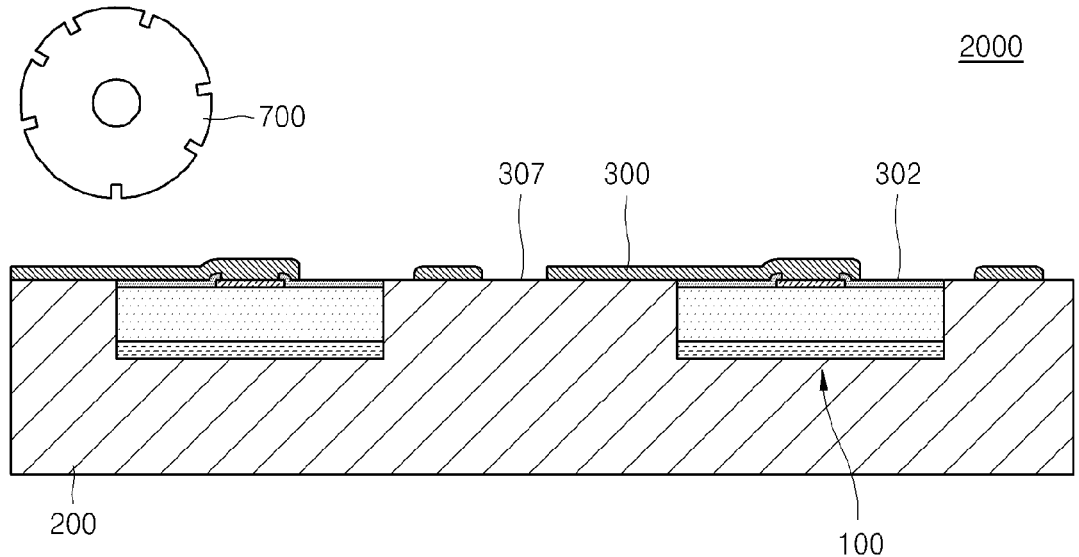

FIGS. 22 and 23 are cross-sectional views of a semiconductor package for explaining a method of manufacturing the semiconductor package 1000b of FIG. 3, according to an embodiment of the inventive concept. FIGS. 22 and 23 correspond to FIGS. 6 and 16.

In this embodiment, although the pad connector 140 is formed on the pad 130 in FIG. 6, the pad connector 140 is not formed on the pad 130 in FIG. 22. Instead, the protection layer 115 is formed on the first surface 305 of the semiconductor substrate 110 around the pad 130 having a relatively small thickness. For example, the protection layer 115 may have a thickness of about 1 µm to about 3 µm.

The processes described with reference to FIGS. 7 through 10 may then be performed in the present embodiment.

Referring to FIG. 23, the metal wiring 300 may be formed over the first surface 302 of the semiconductor chip 100 in which no pad connector is formed and the upper surface 307 of the sealing member 200 using a soft-lithography process such as imprinting or off-set printing (e.g., R2R printing) using a roller 700. The metal wiring 300 may be formed as single layer, and may directly contact a pad. Since the metal wiring 300 forms a single layer, the metal wiring 300 may have a thickness of about 5 µm to about 15 µm. The surface roughness of the metal wiring 300 may be higher than that of a metal wire formed by plating or evaporating. For example, the metal wiring 300 may have a ten-point average roughness Rz of about 3 µm to about 5 µm.

Subsequent processes may be substantially the same as those shown in FIGS. 13 through 15.

Although the metal wiring 300 may be formed as a thick single layer by a soft-lithography process such as imprinting, the processes described with reference to FIGS. 11 and 12 or FIGS. 17 through 21 of forming the seed metal 310 and the plating metal 330 on the semiconductor chips having the structure shown in FIG. 22 may also be performed, and thus the semiconductor package 1000c or 1000d shown in FIG. 4 or 5 can be manufactured.

Figure 24:
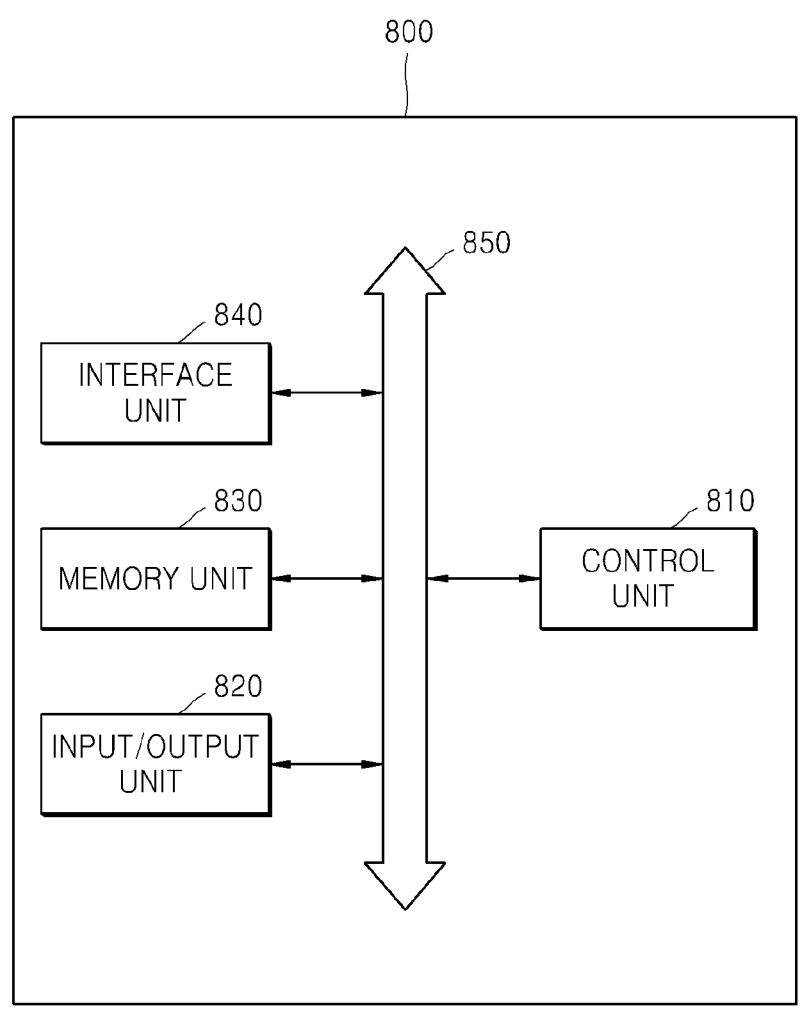
FIG. 24 is a schematic block diagram of an electrical and electronic apparatus including the semiconductor package of FIG. 1 or 2, according to an embodiment of the inventive concept.

FIG. 24 is a schematic block diagram of an electrical and electronic apparatus 800 including a semiconductor package 1000, 1000a, 1000b, 1000c, or 1000d of FIG. 1 through FIG. 5, according to another embodiment of the inventive concept.

Referring to FIG. 24, the electrical and electronic apparatus 800 according to some embodiments may include a control unit 810, an input/output unit 820, a memory unit 830, an interface unit 840, and a bus 850. The control unit 810, the input/output unit 820, the memory unit 830, and the interface unit 840 are connected to each other via the bus 850.

The control unit 810 may include at least one processor for executing a command, for example, a microprocessor, a digital signal processor, or a microcontroller.

The input/output unit 820 may input data or a signal to the electrical electronic apparatus 800, or output data or a signal from the electrical and electronic apparatus 800. For example, the input/output unit 820 may include a keyboard, a key pad, or a display element. The memory unit 830 may store a command executed in the control unit 810, and may include various types of memory such as DRAM, flash, and the like. The interface unit 840 may receive and transmit data over a network.

At least one of the control unit 810, the memory unit 830, and the interface unit 840 of the electrical and electronic apparatus 800 of the present embodiment may be formed as one of the semiconductor packages 1000, 1000a, 1000b, 1000c, or 1000d shown in FIGS. 1 through 5. That is, the semiconductor packages 1000, 1000a, 1000b, 1000c, and 1000d shown in FIGS. 1 through 5 may be a memory chip or a logic chip that functions as the control unit 810, the memory unit 830, and the interface unit 840.

The electrical and electronic apparatus 800 of the present embodiment may be employed in a mobile system, for example, a PDA, a portable computer, a web tablet, a wireless phone, a mobile phone, a digital music player, a memory card, a data receiver or transmitter, or other mobile electronic device.

According to some embodiments, the inventive concept may provide a semiconductor package having no printed circuit board (PCB) in which patterns are formed on a pad by performing a printing process or a soft-lithography process only, without having to perform a photolithography process to form bump and redistribution patterns, thereby improving turn around time (TAT) and reducing costs.

Figure 25:
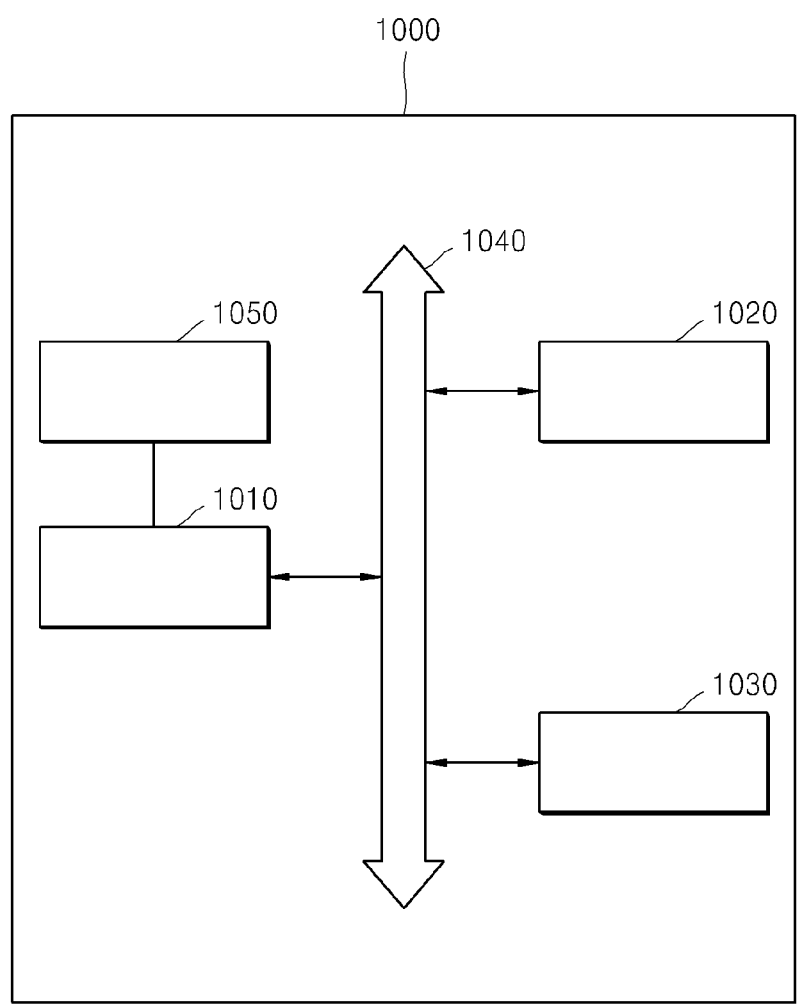
FIG. 25 is a block diagram of an electronic system according to an embodiment of the inventive concept.

FIG. 25 is a block diagram of an electronic system 10000 according to an embodiment of the inventive concept.

Referring to FIG. 25, the electronic system 10000 may include a processor 1010, an input/output device 1030, and a memory chip 1020, where the processor 1010, the input/output device 1030, and the memory chip 1020 may perform data communication with each other by using a bus 1040. The processor 1010 may execute a program and control the electronic system 10000. The input/output device 1030 may be used to input/output data to/from the electronic system 10000. The electronic system 10000 may be connected to an external device, e.g., a personal computer or a network, by using the input/output device 1030 and may exchange data with the external device. The memory chip 1020 may store codes or programs for operations of the processor 1010. For example, the memory chip 1020 and/or the processor 1010 may include any of the semiconductor packages described previously.

The electronic system 10000 may embody various electronic control systems requiring the memory 1020, and, for example, may be used in mobile phones, MP3 players, navigation devices, solid state disks (SSD), or household appliances.

Where any of the previously-described semiconductor devices are used as the memory chip 1020, the thickness or the volume of the electronic system 10000 can be reduced.

According to some embodiments, the processor 1010 may be of any type including but not limited to a microprocessor (μP), a microcontroller (μC), a digital signal processor (DSP), or any combination thereof. The processor 1010 may include a processor core (not illustrated) that can include a floating point unit (FPU), an arithmetic logic unit (ALU), and a digital signal processing core (DSP Core), or any combination thereof. The processor 1010 may also include registers (not illustrated). A memory controller 1050 can also be used with the processor 1010, or the memory controller 1010 can be an internal part of the processor 1010 depending on applications.

For example, the memory chip 1020, the memory controller 1050 and/or the processor 1010 may include any of the semiconductor packages described previously.

The system 10000 may also include an interface bus (not separately illustrated) for facilitating communication from various interface devices (e.g., output interfaces, peripheral interfaces, and communication interfaces) to the system 10000. The output interfaces may be configured to communicate with various external devices such as a display or speakers. The peripheral interfaces may be configured to communicate with external devices or other peripheral devices such as printers, fax machines, scanners and so on.

According to some embodiments, a system may include a semiconductor package which has a semiconductor chip having a chip pad formed on a first surface thereof, a sealing member for sealing the semiconductor chip and exposing the first surface of the semiconductor chip, and a conductive wiring overlying a part of the first surface of the semiconductor chip and directly contacting a part of an upper surface of the sealing member. The conductive wiring may further contact the pad. The package may also include an encapsulant covering the conductive wiring and having openings for exposing parts of the conductive wiring. The system can additionally include an input/output device (e.g., keyboard, mouse, pen, voice input device, touch input device and so on) connected to the package.

The system 10000 may be implemented as a portion of a portable (or mobile) electronic device such as a personal media player device, a wireless web-watch device, a personal headset device, or a hybrid device that includes any of the above functions. In addition, the system 10000 may be implemented as part of a wireless base station or other wireless system or device.

Embodiments of the present application may also be applied to form application specific integrated circuits (ASICs), Programmable logic devices (PLDs), Gate Arrays, digital signal processors (DSPs), Graphics and PC chipsets. Also, embodiments of the present application can be used to form a storage device for notebook PCs and sub-notebooks for enterprises, Ultra-Mobile PCs (UMPC), and Tablet PCs.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various operations will be described as multiple discrete steps performed in a manner that is most helpful in understanding the invention. However, the order in which the steps are described does not imply that the operations are order-dependent or that the order that steps are performed must be the order in which the steps are presented.

While the inventive concept has been particularly shown and described with reference to exemplary embodiments thereof, it will be understood that various changes in form and details may be made therein without departing from the spirit and scope of the following claims.

What is claimed is:

1. A semiconductor package comprising:
   a semiconductor chip having a chip pad formed on a first surface thereof;
   a sealing member for sealing the semiconductor chip and exposing the first surface of the semiconductor chip, wherein the sealing member covers all surfaces other than the first surface of the semiconductor chip;
   a conductive wiring overlying a part of the first surface of the semiconductor chip and directly contacting a part of an upper surface of the sealing member, the conductive wiring further contacting the pad; and
   an encapsulant covering the conductive wiring and having openings for exposing parts of the conductive wiring; and
   a protection layer overlying the first surface of the semiconductor chip, wherein a top surface of the sealing member and a top surface of the protection layer are substantially coplanar.

2. The package of claim 1, wherein the conductive wiring directly contacts the upper surface of the protection layer.

3. The semiconductor package of claim 1, wherein the conductive wiring is formed using a soft-lithography process.

4. The semiconductor package of claim 1, wherein the conductive wiring comprises a seed metal and a plating metal.

5. The semiconductor package of claim 4, wherein the plating metal is formed on upper and side surfaces of the seed metal.

6. The semiconductor package of claim 1, wherein the semiconductor package comprises one of a fan-in structure in which all of solder balls are formed over the first surface of the semiconductor chip, or a fan-out structure in which at least one of the solder balls is formed on the upper surface of the sealing member.

7. A semiconductor package comprising:
   a semiconductor chip having a pad on a first surface thereof;
   a sealing member for sealing the semiconductor chip and exposing the first surface thereof;
   a conductive wiring overlying a part of the first surface of the semiconductor chip and directly contacting a part of an upper surface of the sealing member, the conductive wiring extending from the first surface and electrically connected to the pad, the conductive wiring comprising at least two layers, wherein an upper layer thereof is formed on upper and side surfaces of a lower layer thereof; and
   an encapsulant for covering the conductive wiring, a part of the first surface of the semiconductor chip, and a part of the upper surface of the sealing member, the encapsulant comprising openings for exposing parts of the conductive wiring.

8. The semiconductor package of claim 7, wherein a plating type pad connector is formed on the pad,
   wherein the pad and the conductive wiring are electrically connected to each other through the plating type pad connector,
   wherein the semiconductor chip comprises a protection layer formed on the first surface of the semiconductor chip around the pad, and
   wherein the plating type pad connector has substantially the same height as or is higher than the protection layer.

9. The semiconductor package of claim 7, wherein the lower layer of the conductive wiring comprises a seed metal and the upper layer of the conductive wiring comprises a plating metal,
   wherein the plating metal is formed on the upper and side surfaces of the seed metal.

* * * * *